United States Patent [19]

Rosenkranz et al.

[11] 3,936,428

[45] Feb. 3, 1976

[54] PHOTOPOLYMERIZABLE POLYMER BASED ON AN ETHERIFIED POLYHYDROXYALKYL ACRYLATE

[75] Inventors: Hans-Jürgen Rosenkranz, Krefeld; Hans Rudolph, Krefeld-Bockum; Erich Wolff, Leichlingen; Harald von Rintelen, Leverkusen, all of Germany

[73] Assignee: Bayer Aktiengesellschaft, Germany

[22] Filed: Dec. 27, 1973

[21] Appl. No.: 428,656

Related U.S. Application Data

[62] Division of Ser. No. 256,161, May 23, 1972, abandoned.

[30] Foreign Application Priority Data

May 25, 1971 Germany.......................... 2125909

[52] U.S. Cl. ............... 260/78.5 T; 96/86 P; 96/88; 96/114; 204/122; 260/17.4 CL; 260/17.4 ST; 260/80 P; 260/80.3 N; 260/80.3 E; 260/80.7; 260/80.73; 260/80.75; 260/83.5; 260/85.55; 260/85.7; 260/86.1 E; 260/87.7; 260/89.5 S; 260/91.3 VA

[51] Int. Cl.² ................. C08F 8/30; C08F 216/06; C08F 220/12; C08F 222/20

[58] Field of Search............. 260/80.73, 78.5, 80.81, 260/80.3 N, 80.3 E, 89.5 S, 91.3 VA, 83.5, 80.75

[56] References Cited
UNITED STATES PATENTS

| | | | |
|---|---|---|---|
| 3,231,533 | 1/1966 | Garrett et al. ...................... | 260/29.6 |
| 3,262,985 | 7/1966 | Müller ............................... | 260/80.3 |
| 3,448,089 | 6/1969 | Celeste ............................. | 260/78.5 |
| 3,804,790 | 4/1974 | Sekmakas..................... | 260/29.6 TA |

*Primary Examiner*—Joseph L. Schofer
*Assistant Examiner*—John Kight, III
*Attorney, Agent, or Firm*—Connolly and Hutz

[57] ABSTRACT

Photosensitive polymers and their process of preparation which can be crosslinked by a vinyl polymerization initiated by photochemical means and which are derived from the reaction of polymers containing zerewitinoff-active hydrogen atoms with N-methylol compounds or with N-Methylol ethers of acrylamides or substituted acrylamides. The modified polymers optionally in admixture with other vinyl group containing monomers are useful for purposes such as photosensitive copying layers, coatings and molded articles.

15 Claims, No Drawings

PHOTOPOLYMERIZABLE POLYMER BASED ON AN ETHERIFIED POLYHYDROXYALKYL ACRYLATE

This application is a division of application Ser. No. 256,161 as filed May 23, 1972 and now abandoned.

The present invention relates to new compounds which form cross-linked polymers, their production, and their use.

Polymer systems which harden under the influence of light to form insoluble cross-linked coatings are known in great numbers in the field of varnishes as well as for a variety of copying processes.

Systems in which polymeric compounds which contain vinyl groups and are cross-linked by a vinyl polymerisation initiated by photochemical means have acquired special interest for copying processes, mainly on account of the high degree of cross-linking which can be attained. An example known from the literature is the reaction product of a polymer carrying glycidyl groups with acrylic acid [Deutsche Offenlegungsschrift (German Pat. No.) 1,645,125]. However, this system has the disadvantage that its preparation requires a high stabilisation in order to prevent premature cross-linking, and that this strongly impairs the photo-sensitivity of the final product. The problem of having strongly to stabilise polymers carrying vinyl groups already during the condensing on of the vinyl compounds for protection against premature cross-linking has generally impaired the use of these products for photocopying processes.

Moreover, these systems as well as virtually all other systems cross-linked by photopolymerisation, are characterised by an inconvenient sensitivity to oxygen which necessitates exposure in an inert gas atmosphere or through a covering foil.

Surprisingly, it has now been found that the reaction of polymers containing Zerewitinoff-active hydrogen atoms with N-methylol compounds or with N-methylol ethers of acrylamides or substituted acrylamides yields high-molecular compounds which contain vinyl groups and which are useful in this context.

This invention provides compounds (preferably having a molecular weight greater than 1000) containing at least two groups of the general formula:

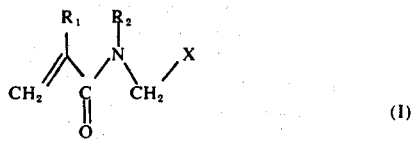

in which $R_1$ is a hydrogen atom or an alkyl group having up to four carbon atoms;
$R_2$ is a hydrogen atom or an alkyl group having up to eight carbon atoms; and
X is an oxygen atom or an —NH— or

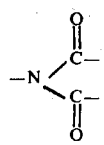

group.

The invention also provides a process for the production of the above compounds comprising homogeneously mixing a compound having Zerewitinoff-active hydrogen atoms [preferably of molecular weight greater than 1000] with a vinyl compound of the general formula:

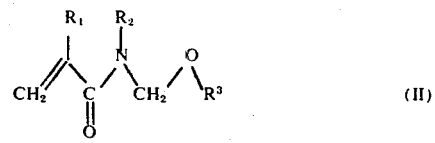

[in which $R_1$ and $R_2$ are as defined above and $R_3$ is a hydrogen atom or an alkyl group having up to eight carbon atoms], and reacting with the said compounds in the presence of an acid catalyst [except when the said compound having Zerewitinoff-active hydrogen atoms has acid functional groups] such as a mineral acid, an organic sulphonic acid, or a carboxylic acid, at −10 to +140°C., preferably at +10° to +120°C.

The invention also relates to the use of the compounds containing the groups of the general formula (I) optionally in admixture with other vinyl groups-containing compounds to produce cross-linked polymers, especially in the form of coatings. The formation of cross-linked polymers or copolymers may be initiated thermally, for example by use of the conventional thermal radical initiators, or by irradiation with electromagnetic irradiation, especially be light, if desired with the use of photoinitiators.

Suitable polymers for use in producing the new compounds are, in principle, all those which contain, per molecule, at least two functional groups which are capable or reacting under acidic catalysis with N-methylol groups and/or N-methylol ethers with the formation of a bond. Suitable functional groups are generally all groups carrying Zerewitinoff-active hydrogen atoms, especially hydroxyl groups, but also carboxamido, and amino groups; there may be present functional groups of only one type as well as different functional groups side by side.

Those polymers are mainly preferred for the process according to the invention which, when applied to a carrier either from a solution or as a melt, yield tack-free coatings at room temperature already in the non-cross-linked state. However, the process is not limited to such compounds.

The molecular weight of the polymers depends on the intended application and can therefore not be determined independently of the latter. However, polymers with a molecular weight of over 1000 are preferably used.

The average molecular weight best suited for the intended application can be established in a simple way by a few tests, for example, by determination of the softening point. Obviously, the optimal range of molecular weight also depends on the type of the polymer.

Natural substances as well as synthetic high-molecular compounds are suitable for preparing the new compounds. Suitable natural polymers are, for example, cellulose, starch or gelatin or processed derivatives of these natural substances such as e.g. partially esterified or etherified cellulose.

Suitable synthetic polymers for use in preparing the new compounds are, for example, polyvinyl alcohols or copolymers of vinyl alcohol with any polymerisable monomers which do not react with the N-methylol or N-methylol ether groups of the compounds of the formula (II) to form reaction products containing vinyl groups, in particular with vinyl monomers, for example, with ethylene, propylene, butylene, butadiene, isoprene, vinyl chloride, vinylidene chloride; with vinyl esters, especially vinyl acetate or vinyl propionate; with vinyl ethers, e.g. vinyl propyl ether, vinyl isobutyl ether; with acrylic or methacrylic acid or their derivatives such as esters, especially with aliphatic $C_1-C_5$-alcohols; or with nitriles; with maleic acid anhydride; or with styrene.

Polycondensation products with Zerewitinoff-active hydrogens, especially with alcoholic hydroxyl groups, are also suitable, for example, polyesters of polyvalent aliphatic or aromatic carboxylic acids with polyhydric alcohols; polyurethanes containing hydroxyl groups; or epoxide resins containing hydroxyl groups, such as are obtained, for example, by reacting polyvalent carboxylic acids, alcohols or amines with epihalohydrins, especially with epichlorohydrin.

Those polymers are preferably used which can be obtained by polymerisation of hydroxyalkyl esters of acrylic acid or α-alkyl-substituted acrylic acids, or by copolymerisation of these compounds with other vinyl compounds, for example, those mentioned above which do not react with the N-methylol or N-methylol ether groups of the compounds of the formula (II) to form reaction products containing vinyl groups.

In those cases in which, for example, polymers containing vinyl alcohol units are used for the preparation of the new compounds according to the invention, the polymers consist of carbon chains containing recurrent units of the formula (III)

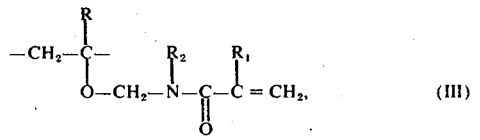

in which
  $R_1$ and $R_2$ have the same meaning as above; and
  R means H or $C_1-C_4$-alkyl, preferably methyl.

In those cases in which, for example, polymers derived from polymeric hydroxyalkyl acrylates are used, the polymers consist of carbon chains containing recurrent units of the formula (IV)

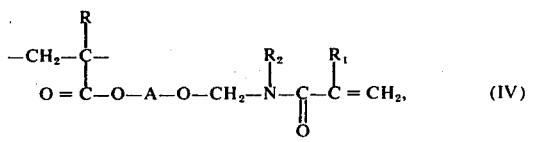

in which
  R, $R_1$ and $R_2$ have the same meaning as above; and
  A means a bivalent aliphatic radical which may be interrupted by oxygen atoms, such as ethylene, propylene, isopropylene, butylene, radicals of the formula $-(CH_2-CH_2-O)_m-CH_2-CH_2-$ where m represents an integer of 1 or more than 1, preferably 1 to 3.

In some cases it may also be expedient to replace the hydroxyalkyl esters of acrylic acid or its derivatives completely or partially with acrylamide, methacrylamide, maleic imide or other monomers carrying amide or imide groups. Finally, it is also possible to react polymers carrying amino groups, such as are obtained e.g. by copolymerisation of aminoethyl acrylate or aminoethyl methacrylate with other vinyl monomers.

Vinyl compounds (II) containing N-methylol groups or N-methylol ether groups in the meaning of the invention can be illustrated by the general formula

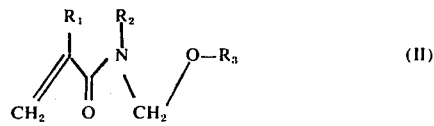

in which
  $R_1$ means H, $C_1-C_4$-alkyl;
  $R_2$ means H, $C_1-C_8$-alkyl; and
  $r_3$ means H, $C_1-C_8$-alkyl,
compounds such as e.g. N-methylol-acrylamide, N-methylolmethacrylamide, N-methoxymethyl-acrylamide, N-ethoxymethylacrylamide, N-methoxymethylmethacrylamide being preferred.

According to the claimed process a suitable compound containing Zerewitmoff-active hydrogen atoms is mixed with the unsaturated N-methylol compound and/or the unsaturated N-methylol ether, either directly or, preferably, in a solvent which is selected in accordance with the solubility of the components to be mixed. In the case of copolymers containing hydroxypropyl or hydroxyethyl acrylate or methacrylate, for example, ethyl acetate, methyl ethyl ketone, butyl acetate, glycol acetate monomethyl ether, are used as solvents.

The amount of vinyl compound (II) to be added depends on the number of reactive groups in the compound containing Zerewitinoff-active hydrogen atoms; as a rule, it is equimolar or smaller, because an excess of vinyl monomer (II) in the mixture, although it does not impair the reactivity of the resultant system which can be cross-linked by vinyl polymerisation, may lead to inhomogeneity or to an undesirable softness of the non-cross-linked film, due to crystallisation. However, deviations from this rule may be indicated in some cases, just as it may also be expedient to add to the system further monomeric vinyl compounds which do not react by transetherification.

To the mixture of vinyl compound (II) and compound containing Zerewitinoff-active hydrogen atoms described above there are usually added according to the invention 0.01–5% by weight, preferably 0.1–1% by weight, referred to solids, of an acidic catalyst, for example, an organic sulphonic acid such as e.g. p-toluene-sulphonic acid; or a carboxylic acid such as, for example, malonic acid, maleic acid, oxalic acid, tartaric acid, trichloroacetic acid, dichloroacetic acid, cyclopropane-1,1-dicarboxylic acid, cyanoacetic acid. However, the process is in no way limited to these acids; further carboxylic acids as well as mineral acids such as HCl, phosphoric acid or sulphuric acid may also be used. In the case where the starting compound already contains acidic functional groups such as carboxyl groups or sulphonic acid groups, such an addition may be dispensed with.

The condensation of the starting compound with the added vinyl compound (II) normally starts with the addition of the acidic catalyst. This condensation is an equilibrium reaction: depending on the choice of solvent and the number of reactive groups in the polymer, only part of the vinyl compound (II) will be condensed with the reactive groups of the polymer in solution. However, complete conversion is achieved in any case when the mixture is applied to the desired carrier, and the liberated water and/or the alcohol liberated from the N-methylol ether evaporates with the solvent.

Complete etherification or transetherification and thus condensation of the vinyl compound (II) on to the compound can already be achieved in solution if a solvent is chosen which permits, on account of its comparatively high boiling point, distilling off under reduced pressure at temperatures below 40°C the water or the alcohol liberated during condensation. Suitable solvents are here, for example, methyl glycol acetate, ethyl glycol acetate and analogous compounds, but also higher ketones.

In a typical application of the process according to the invention, a vinyl monomer containing hydroxyl groups is first polymerised, either by itself or in combination with other vinyl monomers the proportion of which may amount to up to 90% by weight, in known manner in a solvent such as e.g. methyl ethyl ketone, isopropanol or ethyl acetate.

The resultant polymer solution is cooled to room temperature and mixed with a catalytic amount of p-toluenesulphonic acid. The amount of vinyl compound (II) corresponding to the number of hydroxyl groups is then added. Depending on the intended application, the mixture so obtained can be protected against premature cross-linking by means of one of the conventional polymerisation inhibitors such as hydroquinone, toluhydroquinone, di-tert.-butylphenol, di-tert.-butyl-p-cresol or copper compounds. The amounts required for this purpose are within the conventional range and can be determined for the intended application by simple tests, i.e. by determination of the storability at elevated temperature or determination of the reactivity during the subsequent cross-linking process. As a rule, there are used amounts of 0–1% by weight.

If the mixture so obtained is to be used for the production of copying layers, the usual photoinitiators, e.g. benzoin derivatives such as benzoin, benzoin ether or hydroxymethyl-benzoin, or anthraquinone derivatives such as halogen- or alkyl-substituted anthraquinones, may be added in amounts of 0.1–10%.

It may be necessary to add further solvents, for example, for influencing the drying properties, plasticisers, flow agents, dyestuffs or other fillers which absorb as little as possible, or not at all in the spectral range of the light initiating the photopolymerisation. Likewise, it may be expedient in some cases to add to the mixture further inert polymers and/or further mono- or polyfunctional vinyl compounds.

The solution so obtained is applied to the desired carrier of the layer by means of dipping, spraying, pouring, rolling, whirling or by another conventional method of application. After evaporation of the solvent which may be carried out at an elevated temperature, for example, at 80°C, there is obtained a dry, tack-free film, since after this period of time also the unsaturated vinyl compound containing N-methylol or N-methylol ether groups will usually have reacted with the functional groups of the polymer.

The resultant soluble film can be cross-linked, either directly or after recoating on to a further layer carrier, for example, by polymerisation with the aid of light. In contrast to the systems hitherto used which can be cross-linked by vinyl polymerisation, the coating according to the invention makes it possible to dispense with the use of a covering foil and with working in an oxygen-free atmosphere.

After the cross-linking polymerisation of the exposed parts of the coating, the unexposed parts can be dissolved with an organic solvent and washed off. Solvents suitable for this purpose are mainly those which can also be used for applying the layer and, in addition, those in which the non-cross-linked compound preferably dissolves; chlorinated hydrocarbons, alcohols, ketones, esters and aromatic hydrocarbons can be used, for example. The cross-linked insoluble parts of the layer adhere to the layer carrier and resist all conventional caustic solutions such as dilute nitric acid and iron(III) chloride solution as well as metal deposition in conventional baths.

Suitable layer carriers are metal foils of copper-aluminium, zinc, magnesium, steel and the like; furthermore paper, glass or foils or polymeric products such as cellulose esters, polyvinyl acetate, polystyrene, polycarbonates, especially those derived from bisphenylol-alkanes, polyesters, especially those derived from polyethylene terephthalate, polyamides, such as, for example, nylon. Further suitable substrates are materials of net-like structure such as metal nets. By selecting suitable polymers, it is further possible to produce self-supporting layers.

The photo-cross-linkable layers according to the invention can be used for the production of relief pictures or printing blocks for relief printing, intaglio printing or surface printing. Offset printing processes, screen printing processes, lithographic printing plates or any other printing processes which require a relief picture, as well as engraving processes may be specially mentioned. An important field of application for the layers according to the invention is the use as photo-resists for the production of printed circuits, the production of etched moulded parts, the production of moulded parts according to the electroforming process, and the production of integrated microcircuits.

A particular advantage of the layers according to the invention consists in their insensitivity to oxygen. This permits of exposure without protective gas atmosphere. The application of a covering foil or covering layer reducing the dissolving power is likewise unnecessary. Moreover, it is possible thermally to transfer finished edged reliefs to a suitable substrate in a particularly simple way by means of a layer applied to a carrier after pictorial exposure and development.

Exposure of the layers produced according to the invention is carried out by means of the light sources conventionally used in reproduction technique, such as carbon arc lamps, xenon lamps, high pressure mercury lamps, which supply, besides visible light, a proportion of ultraviolet light which is particularly effective for the polymerisation.

In the preceding, the polymer systems which can be cross-linked by radical polymerisation, are primarily discussed with regard to their use for certain photosensitive copying layers. It is to be understood that the new compounds according to the invention can also be used for other coatings where subsequent cross-linking is important. For example, they can also be used quite generally for varnishes and coatings.

The cross-linking reaction can be initiated not only by light: other rays rich in energy may also be used, such as electron rays, X-rays, and e.g. γ-rays. Initiation of the cross-linking reaction is further possible by means of the usual polymerisation starters for vinyl polymerisation, such as e.g. organic peroxides. Consequently, the limitation regarding fillers, which is necessary for photochemically initiated cross-linking is not valid for this extended application: in principle, all pigments and additives conventionally used, for example, in unsaturated polyesterstyrene varnishes, may be added.

The manifold possibilities of application for the cross-linkable polymers according to the invention may be illustrated with the aid of the following Examples.

EXAMPLE 1

Production of the Polymer 868 g ethyl acetate were heated in a nitrogen atmosphere under reflux in a three-neck flask of 2 liters capacity fitted with stirrer, reflux condenser and dropping funnel. A mixture of 288 g methacrylic acid hydroxypropyl ester, 150 g methyl methacrylate, 150 g ethyl acrylate and 9 g azo-isobutyric acid dinitrile were added dropwise within 3 hours. When the dropwise addition was completed, there was added 1 g azo-isobutyric acid dinitrile in 10 g ethyl acetate, and heating under reflux was continued for a further 5 hours. The ethyl acetate was partially distilled off, and the highly viscous polymer solution was concentrated by evaporation in a vacuum drying cabinet at 15 mm/50°C for 24 hours to give a solid colourless resin (580 g). 234 g of this resin, 800 mg p-toluene-sulphonic acid and 60 mg hydroquinone were dissolved in 300 g glycol acetate monomethyl ether. 80 g N-methylol-acrylamide dissolved in 200 g methanol were added to this solution at room temperature, and this mixture was stirred at room temperature in a water jet vacuum for 3 hours, methanol and the liberated reaction water being thus evaporated off.

Photosensitive Material

A solution of the polymer prepared in this way is diluted with glycol acetate monomethyl ether to 30% by weight and sensitized with 2% by weight, referred to the dry film-forming polymer, of 2-tert.-butyl-anthraquinone. After whirling on to a clean copper sheet at 200 r.p.m. and subsequent drying at room temperature for 8 hours, there results a layer of 25 μ thickness.

Processing

The above layer is exposed for 4 minutes in a Chem-Cut vacuum frame through a 0.15 grey step tablet. Development with ethyl acetate/i-propanol gives a sharp positive relief picture of 9 steps of the test tablet.

On account of its good thermoplastic properties, the product prepared and sensitized as described above, after coating and drying, is excellently suitable for transfer from a carrier foil (e.g. Hostaphan PKHH) to a suitable substrate by means of hot rollers at 120°C. After pictorial exposure through a line pattern and subsequent developement, a sharp positive picture of the pattern is obtained.

Moreover, corresponding layers on a carrier foil can be transferred, after exposure and development, as a finished etched relief in exactly the same manner.

EXAMPLE 2

Preparation of the Polymer 150 g methyl ethyl ketone were heated under reflux in a nitrogen atmosphere in a three-neck flask of 1 liter capacity fitted with stirrer, reflux condenser and dropping funnel. A mixture of 108 g hydroxypropyl methacrylate, 32 g butyl acrylate and 2.1 g azo-isobutyric acid dinitrile was added dropwise within 1½ hours. When the dropwise addition was completed, there were added a further 0.2 g azo-isobutyric acid dinitrile and heating was continued under reflux for a further 2 hours. The solvent was then partially evaporated, and the highly viscous polymer solution was concentrated by evaporation in a vacuum drying cabinet at 15 mm/50°C for 24 hours to form a solid colourless resin (135 g). The dry resin, 700 mg p-toluene-sulphonic acid and 50 mg hydroquinone were dissolved in 180 g methyl glycol acetate and mixed at room temperature with 86 g N-methoxymethyl-acrylamide.

Photosensitive Material

The resin solution was sensitized with 2% by weight, referred to the dry film-forming polymer, of 2-tert.-butylanthraquinone and coloured with 0.5% by weight of waxoline rhodamine.

Processing

Coating at 0.5 m per minute from an immersion dish on to a polyester foil (Mylar) of 36 μ thickness yielded, after drying, films of a thickness of 40 μ. These could be thermally transferred at 120°C to a clean copper foil. After pictorial exposure and development in i-propanol, there resulted sharp positive pictures of the pattern.

EXAMPLE 3

A polymer was prepared in analogy with Example 2 from
65 g hydroxyethyl methacrylate
75 g methyl methacrylate
40 g acrylonitrile in 180 g ethyl methyl ketone
and this was dried in a vacuum.

150 g of the solid polymer were dissolved in 150 g methyl glycol acetate and, after the addition of 480 mg p-toluene-sulphonic acid and 190 mg 2,6-di-tert.-butyl-p-cresol, mixed with 48 g N-methoxymethyl-acrylamide, sensitized as described in Example 1, and successfully used for the production of a relief picture.

EXAMPLE 4

A polymer was prepared in analogy with Example 2 from
144 g hydroxypropyl methacrylate
75 g ethyl acrylate
78 g styrene in 300 g toluene.
119 g of the resultant solution in toluene were mixed with 23 g N-methoxymethyl-acrylamide, 0.2 g p-toluene-sulphonic acid and 0.074 mg di-tert.-butyl-p-cresol, sensitized as described in Example 1, and successfully used for the production of a relief picture.

EXAMPLE 5

60 g of the solid solvent-free polymer of Example 1 were dissolved in 60 g methyl ethyl ketone and mixed in succession with 0.2 g p-toluene-sulphonic acid, 0.074 g di-tert.-butyl-p-cresol and 25.9 g N-methoxymethyl-methacrylamide. After being sensitized with tert.-butyl-anthraquinone, also this mixture can be successfully used for the production of a relief picture, as described in Example 1.

EXAMPLE 6

60 g of the solid solvent-free polymers of Example 1 were dissolved in 60 g methyl ethyl ketone and mixed in succession with 0.25 g oxalic acid, 0.074 g di-tert.-butyl-p-cresol and 24.5 g N-methoxymethyl-acrylamide. The solution is sensitized with 2% by weight, referred to the dry film-forming polymer, of 2-tert.-butyl-anthraquinone and whirled on to a copper plate as described in Example 1. After drying at 100°C for 15 minutes and exposure through a pattern, a positive relief picture was obtained in analogy with Example 1.

EXAMPLE 7

500 g methyl glycol acetate were heated in a nitrogen atmosphere at 110°C in a three-neck flask of 2 liters capacity fitted with stirrer, reflux condenser and dropping funnel. A mixture of 142 g acrylamide, 150 g methyl methacrylate, 150 g ethyl acrylate and 15 g benzoyl peroxide was added dropwise within 6 hours, and the mixture was kept at 110°C for a further 2 hours. The slightly turbid polymer solution was allowed to cool down and subsequently dried in a vacuum drying cabinet at 60°C/12 mm (440 g).

110 g of this polymer were dissolved in 150 g dimethyl formamide, mixed in succession with 250 mg p-toluene-sulphonic acid, 23 g N-methoxymethyl-acrylamide, 100 mg 2,6-di-tert.-butyl-p-cresol and 6 g 2-chloromethyl-anthraquinone, and the mixture was homogenised.

The resultant solution was drawn on a metal plate to form a film of 200 μ thickness. The film was dried at 50°C/12 mm for 18 hours and subsequently exposed through a pattern as described in Example 1. After development with methyl glycol acetate, there resulted a sharp positive picture of the pattern.

EXAMPLE 8

A polymer was prepared in analogy with Example 2 from
67.8 g maleic imide
70 g methyl methacrylate
89.6 g butyl acrylate in 300 g methyl ethyl ketone, and this was dried in a vacuum.

The polymer was dissolved in 250 g methyl glycol acetate and, after the addition of 800 mg p-toluene sulphonic acid and 80 mg hydroquinone, mixed with 77 g N-methoxymethylacrylamide, sensitized as described in Example 1, and successfully used for the production of a positive relief picture.

EXAMPLE 9

500 g ethyl acetate were heated under reflux in a nitrogen atmosphere in a three-neck flask of 2 liters capacity fitted with stirrer, reflux condenser and dropping funnel. A mixture of 288 g hydroxypropylmethacrylate, 150 g methyl methacrylate, 150 g ethyl acrylate, 45 g acrylic acid and 4.5 g azo-butyric acid dinitrile was added within 1 hour. After this period of time, 0.5 g azo-isobutyric acid dinitrile in 40 g ethyl acetate were added dropwise within a further hour. After a further 2 hours under reflux, the mixture was cooled to room temperature, and 1 g 2,6-di-tert.-butyl-p-cresol, 2 g p-toluene-sulphonic acid and 230 g N-methoxymethyl-acrylamide were successively added to the polymer solution. This solution was sensitized with tert.-butyl-anthraquinone as described in Example 1 and successfully used for the production of a relief picture. A corresponding experiment without the use of p-toluene-sulphonic acid yielded solvent-resistant relief pictures after a drying time of 3 days at 40°C.

EXAMPLE 10

100 g of a saturated polyester derived from phthalic acid and trimethylol-propane with an acid number of 3 and an OH number of 263 (viscosity of a 50% by weight solution in ethyl acetate: 850 cp) were dissolved in 100 g methyl glycol acetate and homogenized in succession with 200 mg p-toluene-sulphonic acid, 50 mg hydroquinone and 54 g N-methoxymethylacrylamide at room temperature. This solution was mixed with 2 g benzoin isopropyl ether and applied to a metal plate as a layer of 200 μ thickness. After drying at 40°C/12 mm for 18 hours, there resulted a tack-free coating which, when exposed through a pattern according to Example 1 and developed, yielded a sharp positive relief picture.

EXAMPLE 11

The photoinitiator-free polymer solution of Example 1 was applied to a steel plate of 0.5 mm thickness as a layer of 150 μ thickness and, after resting at room temperature for 10 minutes, irradiated under an electron accelerator in a $N_2$-atmosphere (type: high voltage) with 4.4 Mrad electron rays with an energy of 500 kV and a current strength of 2 mA. After this treatment there resulted a tack-free insoluble film which did not swell, even after 1 minute's treatment with ethyl acetate.

EXAMPLE 12

The photoinitiator-free polymer solution of Example 1 was mixed with 2% by weight benzoyl peroxide (referred to solids content). A coating of 200 μ thickness prepared therefrom on a glass plate was stoved, after storage at room temperature for 10 minutes, at 150°C for 10 minutes. A nail-hard solvent-resistant coating was obtained.

What we claim is:

1. A photopolymerizable polymer having a backbone of from 10 to 100% by weight of a free radical polymerized monomer of the formula $$CH_2=CR-CO-A-OH$$

and 90 to 0% by weight of at least one free radical polymerized comonomer selected from the group consisting of ethylene, propylene, butylene, butadiene, isoprene, vinyl chloride, vinylidene chloride, vinyl acetate, vinyl propionate, vinyl propyl ether, vinyl isobutyl ether, acrylic acid, methacrylic acid, esters of acrylic and methacrylic acid with alcohols having 1 to 5 carbon atoms, acrylic acid nitrile, methacrylic acid nitrile, maleic acid anhydride and styrene, said backbone having at least two hydroxyl groups which are etherified with a monomer of the formula $$CH_2=\overset{R_1}{\underset{|}{C}}-CO-\overset{R_2}{\underset{|}{N}}-CH_2-OR_3,$$

each of R and $R_1$ being separately selected from the group consisting of hydrogen and alkyl having 1 to 4 carbon atoms, $R_2$ being selected from the group consisting of hydrogen and alkyl having 1 to 8 carbon atoms, $R_3$ being selected from the group consisting of hydrogen and alkyl having 1 to 8 carbon atoms and A being a bivalent radical selected from the group consisting of ethylene, propylene, isopropylene, butylene and $-(CH_2CH_2O)_{\overline{m}}CH_2CH_2-$ wherein $m$ is 1, 2 or 3.

2. The photopolymerizable polymer of claim 1 wherein R is methyl and A is propylene.

3. The photopolymerizable polymer of claim 2 wherein said comonomer is a mixture of methylmethacrylate and ethylacrylate.

4. The photopolymerizable polymer of claim 3 wherein $R_1$, $R_2$ and $R_3$ are each hydrogen.

5. The photopolymerizable polymer of claim 2 wherein said comonomer is butylacrylate.

6. The photopolymerizable polymer of claim 5 wherein $R_1$ and $R_2$ are each hydrogen and $R_3$ is methyl.

7. The photopolymerizable polymer of claim 1 wherein R is methyl and A is ethylene.

8. The photopolymerizable polymer of claim 7 wherein said comonomer is a mixture of methylmethacrylate and acrylonitrile.

9. The photopolymerizable polymer of claim 8 wherein $R_1$ and $R_2$ are each hydrogen and $R_3$ is methyl.

10. The photopolymerizable polymer of claim 2 wherein said comonomer is a mixture of ethylacrylate and styrene.

11. The photopolymerizable polymer of claim 10 wherein $R_1$ and $R_2$ are each hydrogen and $R_3$ is methyl.

12. The photopolymerizable polymer of claim 3 wherein $R_1$ and $R_3$ are each methyl and $R_2$ is hydrogen.

13. The photopolymerizable polymer of claim 3 wherein $R_1$ and $R_2$ are each hydrogen and $R_3$ is methyl.

14. The photopolymerizable polymer of claim 2 wherein said comonomer is a mixture of methylmethacrylate, ethylacrylate and acrylic acid.

15. The photopolymerizable polymer of claim 14 wherein $R_1$ and $R_2$ are each hydrogen and $R_3$ is methyl.

* * * * *